(12) United States Patent
Takahashi et al.

(10) Patent No.: US 9,892,216 B2
(45) Date of Patent: Feb. 13, 2018

(54) INFORMATION PROCESSING APPARATUS, METHOD, AND PROGRAM PRODUCT FOR SIMULATING PROCESSES WITH PARENT-CHILD AND SIBLING RELATIONSHIPS

(71) Applicants: Satoshi Takahashi, Kanagawa (JP); Kunihiro Akiyoshi, Fukuoka (JP)

(72) Inventors: Satoshi Takahashi, Kanagawa (JP); Kunihiro Akiyoshi, Fukuoka (JP)

(73) Assignee: RICOH COMPANY, LTD., Tokyo (JP)

( * ) Notice: Subject to any disclaimer, the term of this patent is extended or adjusted under 35 U.S.C. 154(b) by 720 days.

(21) Appl. No.: 14/484,678

(22) Filed: Sep. 12, 2014

(65) Prior Publication Data

US 2015/0081266 A1    Mar. 19, 2015

(30) Foreign Application Priority Data

Sep. 13, 2013 (JP) ................................ 2013-190397
Jun. 25, 2014 (JP) ................................ 2014-129901

(51) Int. Cl.
G06F 17/50 (2006.01)

(52) U.S. Cl.
CPC ...... *G06F 17/5009* (2013.01); *G06F 17/5022* (2013.01); *G06F 17/5027* (2013.01)

(58) Field of Classification Search
CPC .................................................. G06F 9/45504
USPC .......................................................... 703/26
See application file for complete search history.

(56) References Cited

U.S. PATENT DOCUMENTS

| 7,233,404 B2* | 6/2007 | Meilstrup ............ G06F 3/1205 358/1.13 |
| 7,415,399 B2 | 8/2008 | Ikegami et al. |
| 2006/0088323 A1* | 4/2006 | Morisawa .......... G03G 15/5012 399/21 |
| 2011/0316225 A1 | 12/2011 | Takahashi |
| 2013/0016402 A1 | 1/2013 | Takahashi |
| 2013/0215467 A1* | 8/2013 | Fein ...................... G06F 3/1204 358/1.15 |
| 2013/0227530 A1* | 8/2013 | Zhang .................. G06F 11/362 717/129 |

(Continued)

FOREIGN PATENT DOCUMENTS

| JP | 2006-168879 | 6/2006 |
| JP | 2010-045781 | 2/2010 |
| JP | 2010-191705 | 9/2010 |

*Primary Examiner* — Andy Ho
(74) *Attorney, Agent, or Firm* — Oblon, McClelland, Maier & Neustadt, L.L.P.

(57) ABSTRACT

An information processing apparatus includes a simulator configured to simulate a process to be executed by an apparatus based on an operation procedure defined in first definition information, and one or more status changers each configured to detect arrival of a time specified in second definition information by monitoring an event generated based on the simulated process, and to change a status of the simulator to a status specified in the second definition information based on the detected time. In the information processing apparatus, the simulator simulates a process to be executed by the apparatus in accordance with a request from a program to cause the apparatus to execute the process in the status changed by the status changer.

15 Claims, 7 Drawing Sheets

(56) References Cited

U.S. PATENT DOCUMENTS

2014/0016736 A1    1/2014    Takahashi
2014/0089538 A1*   3/2014    Bachrany ................. G06F 3/00
                                                            710/37

* cited by examiner

INFORMATION PROCESSING APPARATUS, METHOD, AND PROGRAM PRODUCT FOR SIMULATING PROCESSES WITH PARENT-CHILD AND SIBLING RELATIONSHIPS

BACKGROUND OF THE INVENTION

1. Field of the Invention

The disclosures discussed herein relate to an information processing apparatus, a method for processing information, and a program product for implementing information processing.

2. Description of the Related Art

Image forming apparatuses such as multifunction peripherals include an application platform. Such image forming apparatuses may be designed to implement application programs (hereinafter simply called "applications") utilizing Application Program Interface (API) provided by the application platform. Publication of the API not only allows manufacturers of the image forming apparatuses to develop applications but also allows third-party vendors other than such manufacturers to develop the applications.

It is desirable to employ an image forming apparatus to check operational capabilities of the applications currently under development. In order to check operational capabilities of the applications, it is ideal to prepare an image forming apparatus for every developer of the applications in an economically efficient way. Further, in a case where two or more developers of the applications share one image forming apparatus, it is preferable to efficiently check capabilities of the applications. Hence, the developers of applications may employ software that emulates or simulates (hereinafter generically referred to as "emulate(s)") operations of hardware or an application platform of the image forming apparatus. Such software is hereinafter called an "emulator".

SUMMARY OF THE INVENTION

Accordingly, it is a general object in one embodiment of the present invention to provide an information processing apparatus, a method for processing information, and a program product for implementing information processing capable of easily reproducing various statuses of an apparatus subject to emulation that substantially obviate one or more problems caused by the limitations and disadvantages of the related art.

In one aspect of the embodiment, there is provided an information processing apparatus that includes a simulator configured to simulate a process to be executed by an apparatus based on an operation procedure defined in first definition information; and one or more status changers each configured to detect arrival of a time specified in second definition information by monitoring an event generated based on the simulated process, and to change a status of the simulator to a status specified in the second definition information based on the detected time. In the information processing apparatus, the simulator simulates a process to be executed by the apparatus in accordance with a request from a program to cause the apparatus to execute the process in the status changed by the status changer.

Other objects, features and advantages of the present invention will become more apparent from the following detailed description when read in conjunction with the accompanying drawings.

DETAILED DESCRIPTION OF THE PREFERRED EMBODIMENTS

For example, each of the developers may be able to efficiently check operational capabilities of the application currently under development by installing the emulator in his or her personal computer (PC). In addition, it may be possible to simultaneously develop a new model of the image forming apparatus and applications designed for the new model by preparing an emulator for the new model of the image forming apparatus.

The related art emulators are not designed for changing various statuses of the image forming apparatus subject to emulation at users' desired timing. Hence, it is desirable that operational capabilities of the applications be checked in various statuses, such as a paper jam status, an out-of-toner status, and an out-of-sheet status in the related art emulators. This may be applied to apparatuses other than the image forming apparatus.

Figure 1:
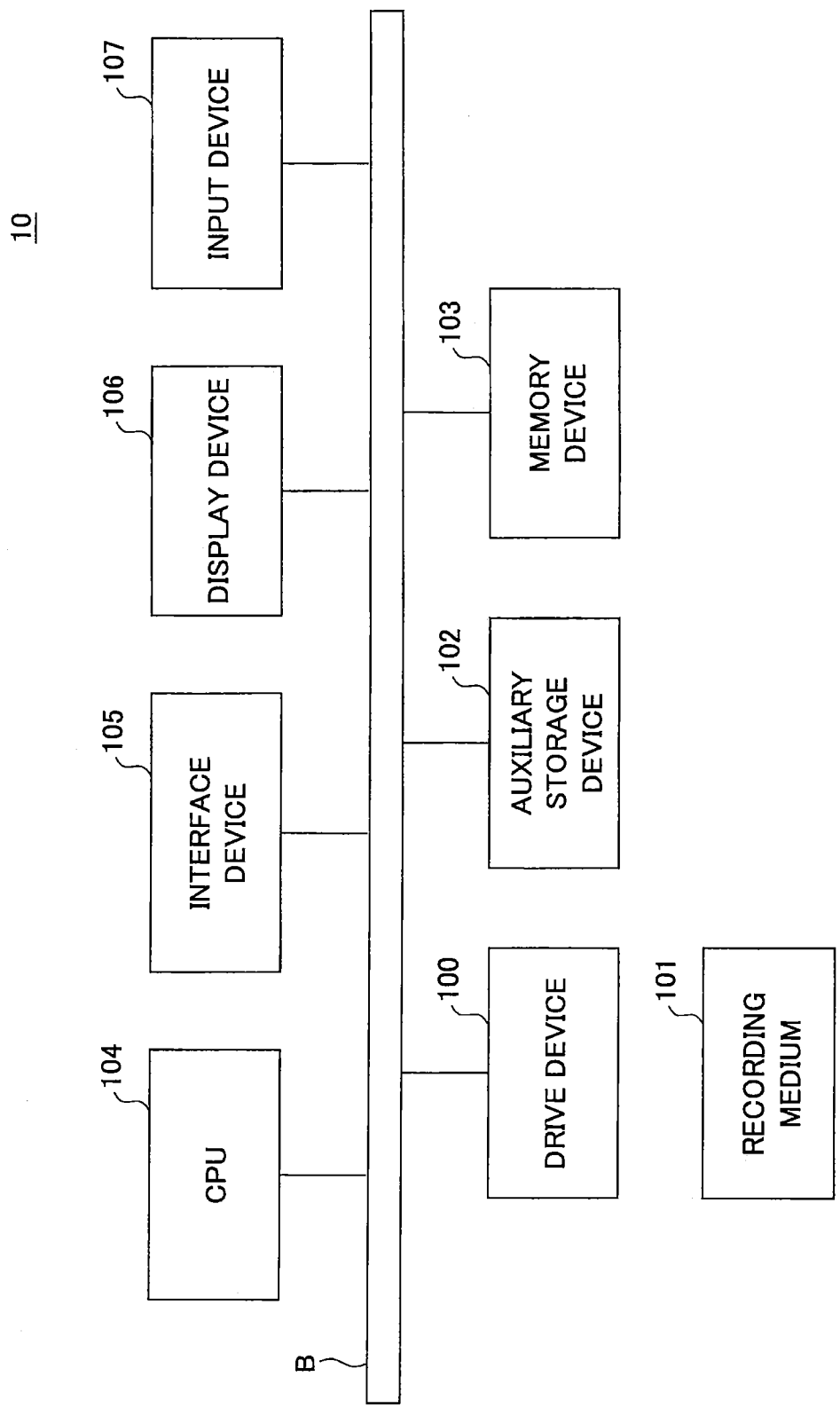
FIG. 1 is a diagram illustrating a hardware configuration example of an information processing apparatus according to an embodiment.

In the following, a description is given of embodiments with reference to accompanying drawings. FIG. 1 is a diagram illustrating a hardware configuration example of an information processing apparatus according to an embodiment. As illustrated in FIG. 1, an information processing apparatus 10 includes a drive device 100, an auxiliary storage device 102, a memory device 103, a CPU 104, an interface device 105, a display device 106, and an input device 107 that are connected to one another via a bus B.

Programs implementing processes in the information processing apparatus 10 are provided in a form of a recording medium 101 such as a CD-ROM. When the recording medium 101 storing the programs is set in the drive device 100, the programs are installed from the recording medium 101 into the auxiliary storage device 102 via the drive device 100. Note that the programs are not necessarily installed from the recording medium 101, and may be downloaded from another computer via a network. The auxiliary storage device 102 is configured to store installed programs as well as storing necessary files, data, and the like.

The memory device 103 is configured to retrieve the programs from the auxiliary storage device 102 and store the retrieved programs when receiving program activation instructions. The CPU 104 is configured to implement functions associated with the information processing apparatus 10 according to the programs stored in the memory device 103. The interface device 105 is configured to serve as an interface for connecting the information processing apparatus 10 to a network. The display device 106 is configured to display a graphical user interface (GUI) based on programming. The input device 107 is composed of a keyboard, a mouse, and the like, and is used by a user to input various operating instructions.

Note that the information processing apparatus 10 may be a computer system formed of a group including one or more configurations illustrated in FIG. 1.

Figure 2:
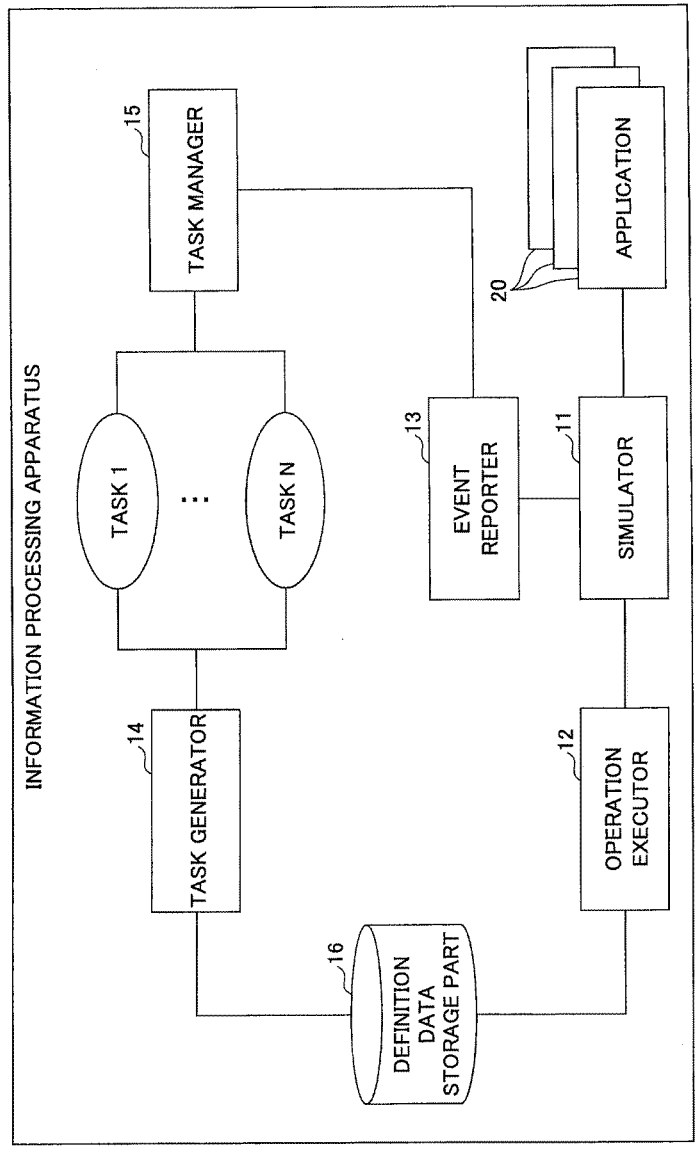
FIG. 2 is a diagram illustrating a functional configuration example of the information processing apparatus according to the embodiment.

FIG. 2 is a diagram illustrating a functional configuration example of the information processing apparatus according to the embodiment. In FIG. 2, the information processing apparatus 10 includes a simulator 11, an operation executor 12, an event reporter 13, a task generator 14, and a task manager 15. The above components may be implemented by programs installed in the information processing terminal 10 that cause the CPU 104 to execute processes. Further, the information processing apparatus 10 utilizes a definition data storage part 16. The definition data storage part 16 may be implemented by utilizing a storage device, and the like that are connected, for example, to the auxiliary storage device 102 or the information processing apparatus 10 via a network. Further, the information processing apparatus 10 has installed one or more applications 20.

The application 20 indicates an application program operable in an application platform of the image forming apparatus (hereinafter called a "target apparatus") that is emulated by the simulator 11. That is, the simulator 11 provides the application 20 with an application program interface (API) similar to an application platform in the target apparatus. The simulator 11 emulates (simulates) processes to be executed by the application platform or operations of hardware of the target apparatus in response to the application 20 retrieving the API. Hence, the simulator 11 may be able to provide the application 20 with an operating environment similar to that of the target apparatus. The API may be a function or a method, or an interface via communications such as representational state transfer (REST), or simple object access protocol (SOAP). Note that in the present embodiment, the term "emulate" or "imitate" includes the meaning of "simulate".

The operation executor 12 is configured to interpret a test scenario included in the test definition data stored in the definition data storage part 16, and input operation instructions into the simulator 11 according to an operation procedure specified in the test scenario. The operation instructions may be implemented by a user's pseudo-operations or virtual operations of the target apparatus. Hence, the simulator 11 is configured to execute a pseudo-process or virtual process according to the operation procedure specified in the test scenario. Note that the test scenario indicates a definition illustrating an operation procedure of the target apparatus performed by a user.

The event reporter 13 is configured to report to the task manager 15 an event generated in a course of the simulator 11 simulating a process executed by the target apparatus. The event indicates information associated with an event that has occurred while the simulator 11 simulates operations of the target apparatus, or information indicating occurrence of the event.

The task generator 14 is configured to generate one or more tasks based on a status change condition included in the test definition data stored in the definition data storage part 16. The status change condition indicates a condition associated with a change of the status of the simulator 11. Each of the status change conditions is composed of a combination of information specifying a time (timing) to change a status, and information specifying the changed status. The task generator 14 is configured to generate a task based on the status change condition. The task is configured to change a status of the simulator 11 according to the status change condition. The change of the status of the simulator 11 corresponds to a change of a status of a pseudo-target apparatus or virtual target apparatus. The entity of each task may be a thread or a process, or an object in object-oriented programming.

The task manager 15 is configured to manage the generated task or distribute (report) an event corresponding to the task. Each of the tasks detects the arrival of (or reaching) the time to change the status (hereinafter called a "changing time") specified in the status change condition of a corresponding one of the tasks based on the event reported from the task manager 15.

Figure 3:
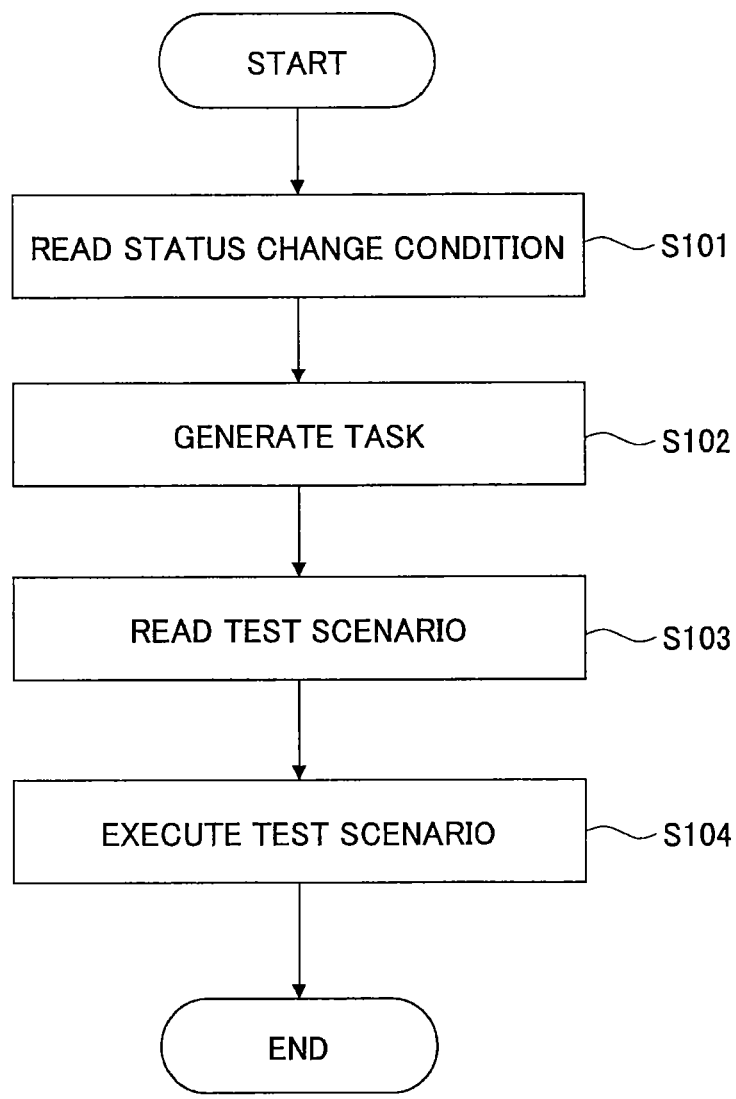
FIG. 3 is a flowchart illustrating an example of a process executed by an information processing apparatus based on test definition data.

A description is given below of a process executed by the information processing apparatus 10. FIG. 3 is a flowchart illustrating an example of a process executed by the information processing apparatus 10 based on the test definition data.

For example, when a test starting instruction is input, the task generator 14 reads a definition associated with the status change condition from the test definition data corresponding to an identification name specified in the test starting instruction, among one or more test definition data stored in the definition data storage part 16 (step S101). The identification name may, for example, be a file name for storing the test definition data.

Figure 4:
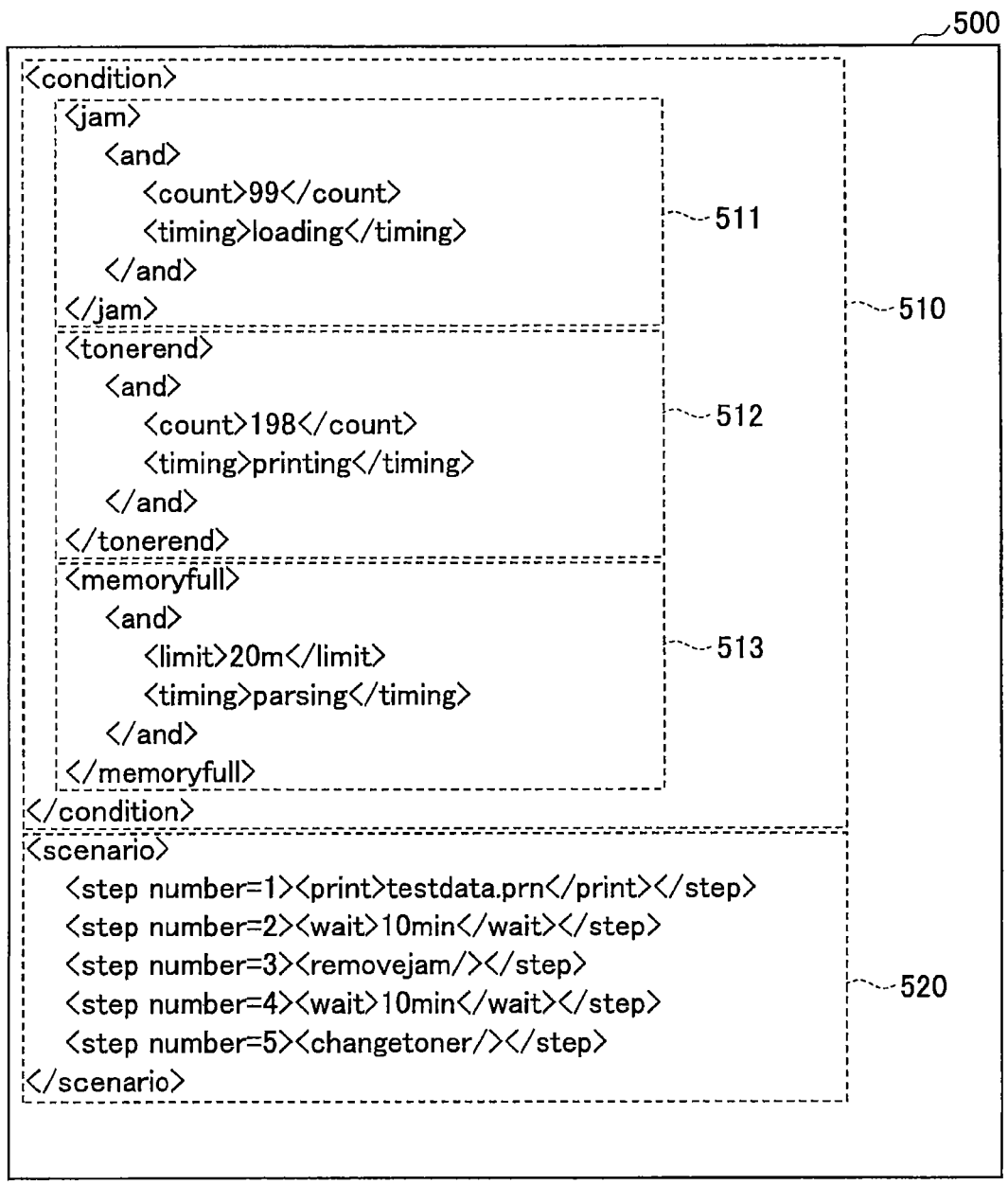
FIG. 4 is a diagram illustrating an example of test definition data.

FIG. 4 is a diagram illustrating an example of the test definition data. The test definition data 500 illustrated in FIG. 4 may enable a test to be performed in the following use case.

In the process of executing printing 300 pages of a document, paper jam is configured to occur at the time of printing the $99^{th}$ sheet. When a user resolves a paper jam status, the printing is configured to restart, and toner is configured to run out at the time of printing $198^{th}$ sheet. Memory consumption (utilization) is configured to be generated in memory full at the time of analyzing a page exceeding 20 MB.

In FIG. 4, the test definition data 500 is described in eXtensible markup language (XML) format. Hence, content of the test definition data 500 is illustrated by employing terms associated with XML. Note that the test definition data 500 may be defined in a format other than the XML format.

The test definition data 500 includes a condition element 510 enclosed with <condition> tags, and a scenario element 520 enclosed with <scenario> tags. The condition element 510 corresponds to a definition associated with the status change condition, and the scenario element 520 corresponds to a definition associated with the test scenario. Hence, in step S101, the condition element 510 is read.

In FIG. 4, the condition element 510 includes a jam element 511, a tonerend element 512, and a memoryfull element 513 as child elements. Each of the jam element 511, the tonerend element 512, and the memoryfull element 513 is matched with a corresponding one of the status change conditions.

The jam element 511 is a definition specifying a time (a time to shift the simulator 11 to the paper jam status) to generate the paper jam status in the simulator 11. The jam element 511 includes an and element as a child element. The and element indicates a logic operation associated with a condition illustrated by plural child elements included in the and element. That is, the and element indicates that it is necessary to satisfy all the conditions of the child elements. Note that though not illustrated, an or element indicates that it is sufficient to satisfy any one of the child elements. Elements corresponding to other logic operations may be used instead of the and element.

The and element includes a count element and a timing element as child elements. The value of the count element indicates a page number of the sheet to be printed. Hence, in the example of FIG. 4, the count element indicates a time (timing) to print the $99^{th}$ sheet (page). The value of the timing element indicates a specific timing in the print process or a status of the simulator 11 that is shifted in the print process.

In the present embodiment, respective values such as "initializing", "ready", "receiving", "parsing", "loading", and "printing" may be specified in the timing elements associated with the print process.

The "initializing" indicates a state of initializing a program that causes the target apparatus to execute a print process. The "ready" indicates a standby state ready to receive print data. The "receiving" indicates a state from the start of receiving the print data to the end of the receiving the print data. The "parsing" indicates a state during the course of analyzing one page of the print data. The "loading" indicates a state during feeding one of print sheets. The "printing" indicates a state of having one page of the print data transferred to the print sheet, and being ready to start to discharge the print sheet.

As described above, the jam element 511 indicates a condition to shift the simulator 11 to the paper jam status at the time of feeding the $99^{th}$ sheet.

The tonerend element 512 is a definition specifying a time (a time to shift the simulator 11 to the out-of-toner status) to generate the out-of-toner status in the simulator 11. The and element serving as the child element of the tonerend element 512 includes the count element and the timing element as child elements. The definitions of the count element and the timing element are already described above. However, the value of the timing element within the tonerend element 512 is "printing".

As described above, the tonerend element 512 indicates a condition to shift the simulator 11 to the out-of-toner status at the time of transferring the $198^{th}$ sheet.

Further, the memoryfull element 513 is a definition specifying a time to generate a memoryfull status where the memory consumption has reached the upper limit in the simulator 11. The and element serving as the child element of the memoryfull element 513 includes a limit element and the timing element as child elements. The value of the limit element indicates the upper limit of the memory consumption. In FIG. 4, "20 m" indicates 20 MB. That is, when the memory consumption reaches 20 MB, the simulator is shifted to the memoryfull status. The details of the timing element are already described above.

Hence, the memoryfull element 513 indicates a condition to shift the simulator 11 to the memoryfull status when the memory consumption has reached 20 MB (i.e., when a page exceeding 20 MB has been read) during the analysis of a certain page of the print data. In the present embodiment, 5 MB are consumed for activation of the program associated with the print process. Further, 5 to 10 MB of memory are consumed for processing each page of the print data. However, 17 MB of memory are configured to be consumed for processing the $220^{th}$ page. That is, a sum of the memory consumption of activating the program and the memory consumption of processing the $220^{th}$ page exceeds 20 MB that is the upper limit of the memory consumption, and the memoryfull status is thus generated.

Note that various statuses that may practically occur in the target apparatus may be specified as the value of the timing element such as an out-of-sheet status or breakage of a certain component. Further, the value specified in the timing element may vary with types of processes to be executed. For example, values such as "initializing", "ready", "loading", "processing", and "waiting" may be specified in the timing element for a scan process. Note that the "initializing" indicates a state of initializing a program that causes the target apparatus to execute a scan process. The "ready" indicates a standby state ready to receive print data. The "loading" indicates a state during feeding a sheet to be scanned. The "processing" indicates scanning in progress. The "waiting" indicates a standby state ready to scan a next page from completing scanning of a certain page.

Subsequently, the task generator 14 generates a task based on a definition (the condition element 510) associated with the read status change condition (step S102). In the present embodiment, tasks to be generated based on the condition element 510 are illustrated in FIG. 5.

Figure 5:
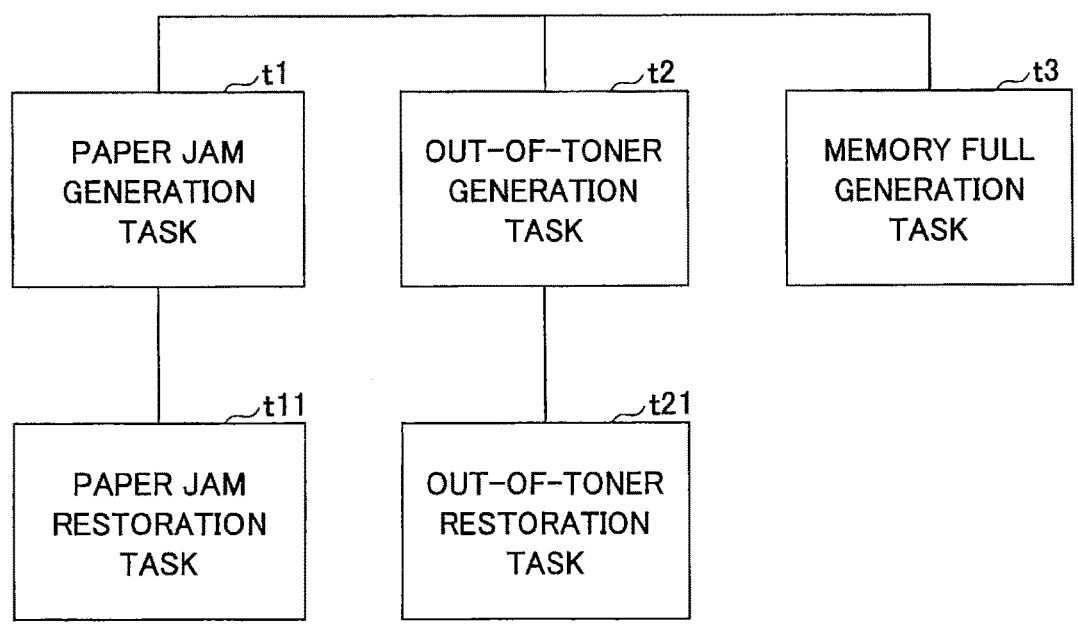
FIG. 5 is a diagram illustrating examples of tasks to be generated.

FIG. 5 is a diagram illustrating examples of tasks to be generated. FIG. 5 illustrates a paper jam generation task t1, a paper jam restoration task t11, an out-of-toner generation task t2, an out-of-toner restoration task t21, and a memory full generation task t3.

The paper jam generation task t1 and the paper jam restoration task t11 are configured to be generated based on the jam element 511. The paper jam generation task t1 is configured to generate a paper jam status (to shift the simulator 11 to a paper jam status) at the time of feeding the $99^{th}$ sheet. The paper jam restoration task t11 is configured to restore a status of the simulator 11 to a status where no paper jam has occurred after a cause of the paper jam is removed.

The out-of-toner generation task t2 and the out-of-toner restoration task t21 are configured to be generated based on the tonerend element 512. The out-of-toner generation task t2 is configured to generate an out-of-toner status (to shift the simulator 11 to the out-of-toner status) at the time of feeding the $198^{th}$ sheet. The out-of-toner restoration task t2 is configured to restore the status of the simulator 11 to a status where no out-of-toner has occurred after the toner has been replaced.

The memory full generation task t3 is configured to be generated based on the memoryfull element 513. The memory full generation task t3 is configured to generate a memory-full status (to shift the simulator 11 to the memory-full status) when memory consumption exceeds 20 MB.

Note that in each of the jam element 511 and the tonerend element 512, two tasks, namely, a task to shift the simulator 11 to a certain status, and a task to restore the status of the simulator 11 from the shifted status, are generated based on one status change condition. Alternatively, the jam element 511 and the tonerend element 512 may include two status change conditions associated with a task to shift a status to a certain status, and a task to restore the status from the shifted status.

In this embodiment, there is a parent-child relationship between the two tasks of a task to shift a status to a certain status and a task to restore the status from the shifted status. The parent-child relationship indicates a serial relationship in an executing order where a child task starts after a parent (a previous) task ends. There may be little significance in generating the child task when the parent task does not end because the parent task serves as a precondition for the child task. Note that the end of the parent task is implemented when a condition set in the parent task is satisfied and the status is changed by the parent task. In FIG. 5, there is a parent-child relationship between the paper jam generation task t1 and the paper jam restoration task t11, and there is a parent-child relationship between the out-of-toner generation task t2 and the out-of-toner restoration task t21.

On the other hand, there is a sibling relationship between the parent tasks. The sibling relationship indicates a parallel relationship in an executing order where the parent tasks are executed in parallel. However, the sibling relationship does not require a completely parallel execution between the parent tasks. The parallel relationship in this case indicates that the start of each of the tasks having the sibling relationship does not limit the ends of other tasks. In FIG. 5, there is a sibling relationship between the paper jam generation task t1, the out-of-toner generation task t2, and the memory full generation task t3.

Note that each of the generated tasks includes settings of information indicating a condition of the corresponding task, and a process to be executed when the condition is satisfied. The condition of the paper jam generation task t1 is to feed the $99^{th}$ sheet. The process to be executed by the paper jam generation task t1 when the condition is satisfied is to shift the simulator 11 to the paper jam status. The condition of the paper jam restoration task t11 is to remove a cause of the paper jam. The process to be executed by the paper jam restoration task t11 when the condition is satisfied is to restore the simulator 11 from the paper jam status. The condition of the out-of-toner generation task t2 is to discharge the $199^{th}$ sheet. The process to be executed by the out-of-toner generation task t2 when the condition is satisfied is to shift the simulator 11 to the out-of-toner status. The condition of the out-of-toner restoration task t21 is to replace (resupply) toner. The process to be executed by the out-of-toner restoration task t21 when the condition is satisfied is to restore the simulator 11 from the out-of-toner status. Note that the condition set in each of the tasks is hereinafter called a "task condition". Further, the generated tasks are transferred to the task manager 15 such that the task manager 15 manages the generated tasks.

Subsequently, the operation executor 12 reads a definition associated with the test scenario included in the test definition data corresponding to the identification name specified in the test starting instruction (step S103). According to the example of FIG. 4, the scenario element 520 is read.

In FIG. 4, the scenario element 520 includes five step elements. Each of the step elements is matched with a corresponding one of the operations represented by the scenario element 520 that are performed on the target apparatus. That is, a child element of each of the step elements indicates a type of an operation performed on the target apparatus. For example, a print element indicates an instruction to print data indicated by the value of the print element. A wait element indicates an instruction to be in a standby state for a period of time indicated by the value of the wait element. A removejam element indicates an operation to remove a jammed sheet that is a cause of the paper jam. A changetoner element indicates replacement of toner.

As described above, the scenario element 520 indicates an operation procedure performed by a user. The operation procedure indicated by the scenario element 520 includes inputting by the user an instruction into print data called "testdata.prn", removing by the user the paper jam after 10 minutes have elapsed, and replacing (resupplying) by the user the toner after another 10 minutes have elapsed.

Note that the testdata.prn is data of 300 pages. Further, a 10 minute standby state in the second step corresponds to a time required for printing 99 pages (sheets) until the paper jam occurs +α. In the present embodiment, print performance of the target apparatus is assumed to be 50 ppm (i.e., 50 pages (sheets) per minute). According to this performance, the target apparatus requires just under 2 minutes to print 99 sheets. Further, in the second step, a 10 minute-standby time is provided by including a time for the user to remove a cause of the paper jam. In the fourth step, a 10 minute-standby time is provided by including a time to print from the $99^{th}$ sheet to the $198^{th}$ sheet and a time to replace the toner.

Subsequently, the operation executor 12 inputs an operation instruction to the simulator 11 based on the procedure in compliance with the test scenario (step S104). As a result, the simulator 11 simulates a process to be executed by the target apparatus based on the operation instruction.

Figure 6:
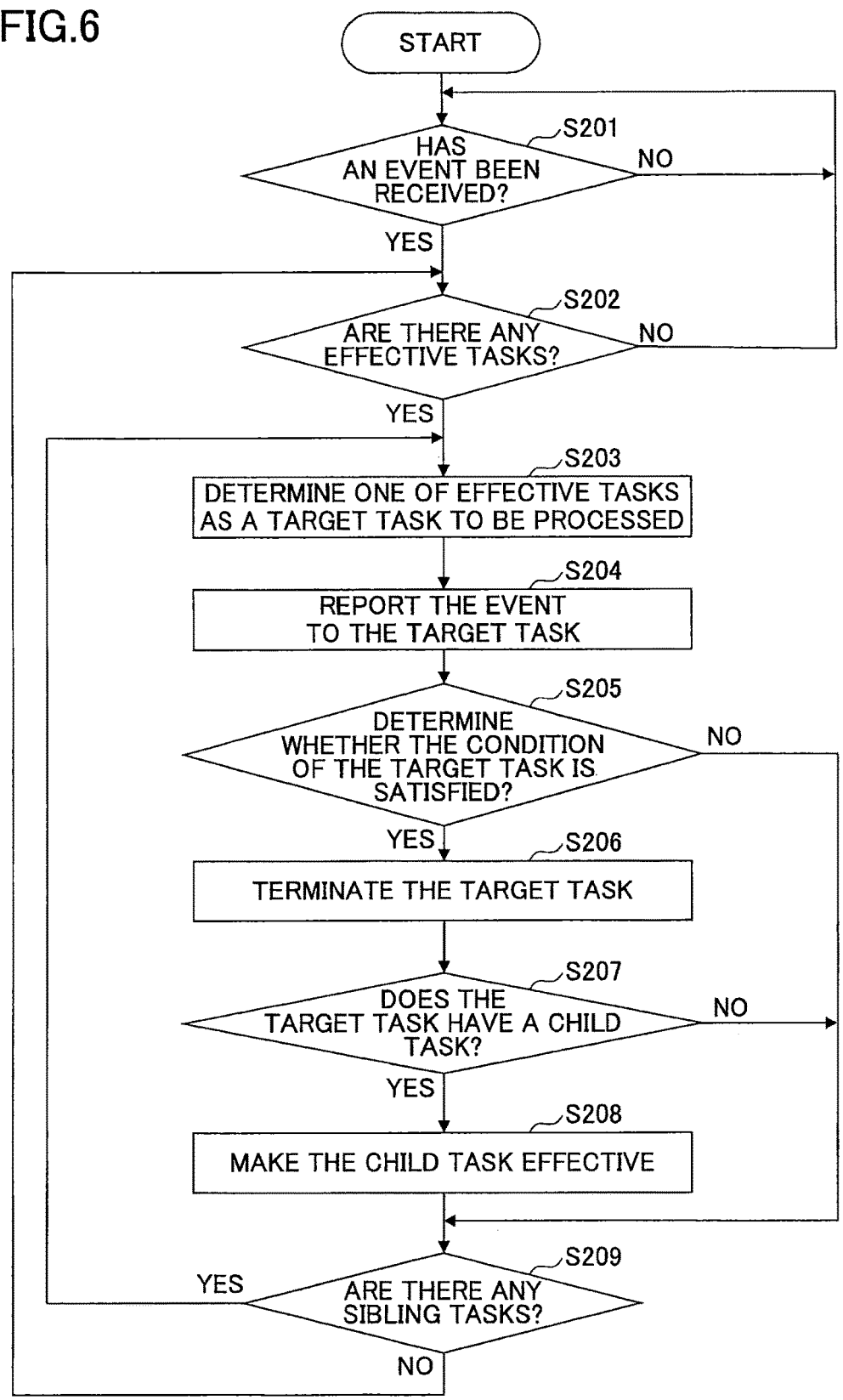
FIG. 6 is a flowchart illustrating an example of a process to be executed by a task manager.

Next, an illustration is given of a process to be executed by the task manager 15. FIG. 6 is a flowchart illustrating an example of a process to be executed by the task manager 15.

The task manager 15 is in a standby mode to receive a report of an event from the event reporter (step S201). That is, the event reporter 13 is configured to report an event generated in a process in which the simulator 11 simulates a process performed by the target apparatus in response to an operation instruction input according to the test scenario. For example, an event indicating feeding or discharging each of the sheets may be reported for executing printing. An event indicating removing a cause of the paper jam may be reported for removing a cause of a paper jam. An event indicating replacing toner is reported for replacing toner. In addition, an event corresponding to a value that is specified in a timing element is reported.

When receiving an event ("YES" in step S201), the task manager 15 determines whether there are any effective tasks (step S202). The effective tasks indicate, among other unfinished tasks, tasks having no parent tasks at present. For example, among the tasks illustrated in FIG. 5, the effect tasks correspond to the paper jam generation task t1, the out-of-toner generation task t2, and the memory full generation task t3.

When there are effective tasks ("YES" in step S202), the task manager 15 determines one of the effective tasks as a target task to be processed (step S203), and reports an event to the target task to be processed (step S204). When the event is reported to the target task, a response indicating whether the condition of the target task is satisfied is returned from the target task, as illustrated later.

Subsequently, the task manager 15 determines whether the condition of the target task is satisfied (step S205). When the condition of the target task is satisfied (step S205), the task manager 15 terminates the target task (step S206). Subsequently, the task manager 15 determines whether the target task has a child task (step S207). When the target task has a child task ("YES" in step S207), the task manager 15 makes the child task effective (step S208). Note that when the target task has no child task ("NO" in step S207), step S208 will not be executed. Further, when the condition of the target task is not satisfied ("NO" in step S205), steps S206 to S208 will not be executed.

Subsequently, the task manager 15 determines whether there are any sibling tasks of the target task (step S209). When there are any sibling tasks ("YES" in step S209), steps subsequent to step S203 are executed on the sibling tasks. When there are no sibling tasks ("NO" in step S209), steps subsequent to step S202 are executed.

In the example of FIG. 5, in an initial state, the event is reported to the paper jam generation task t1, the out-of-toner generation task t2, and the memory full generation task t3.

When the paper jam generation task t1 ends, the paper jam restoration task t11 becomes effective. As a result, the event is reported to the paper jam restoration task t11. Likewise, when the out-of-toner generation task t2 ends, the out-of-toner restoration task t21 becomes effective. As a result, the event is reported to the out-of-toner restoration task t21.

Figure 7:
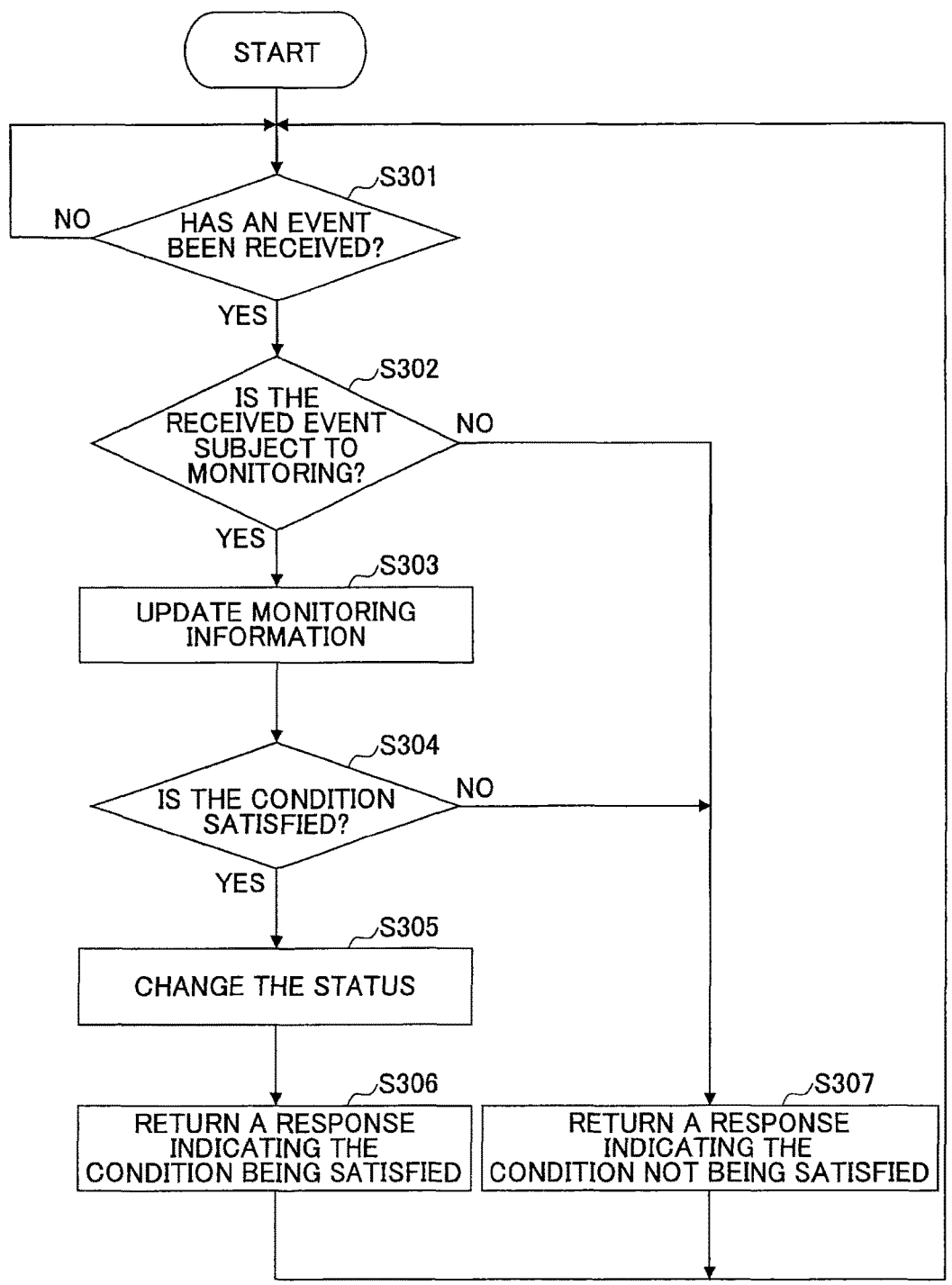
FIG. 7 is a flowchart illustrating an example of a process to be executed by a task.

Next, an illustration is given of a process to be executed by each of the tasks. FIG. 7 is a flowchart illustrating an example of a process to be executed by each of the tasks.

Each of the tasks is in a standby mode to receive an event from the task manager 15 (step S301). When receiving an event from the task manager ("YES" in step S301), the task determines whether the received event is subject to monitoring (step S302). The event subject to monitoring may be specified based on a task condition. For example, the event subject to monitoring for the paper jam generation task t1 is to feed each of sheets. The event subject to monitoring for the paper jam restoration task t11 is to remove a cause of paper jam. The event subject to monitoring for the out-of-toner generation task t2 is to transfer or discharge each of the sheets. The event subject to monitoring for the out-of-toner restoration task t21 is to replace toner. The event subject to monitoring for the memory full generation task t3 is to analyze (translate) print data for each of the sheets and a memory size consumed by the analysis (translation) of the corresponding print data. Note that the received event includes information indicating a corresponding one of the events (feeding a sheet, discharging a sheet, removing a cause of paper jam, replacing toner, analyzing print data, memory consumption, etc.).

When the received event is subject to monitoring ("YES" in step S302), the task updates monitoring information of the task (step S303). The monitoring event is configured to be recorded for detecting whether the condition of the task is satisfied. For example, the monitoring information for the paper jam generation task t1 is the number of times the event indicating feeding a sheet is received. The monitoring information for the paper jam restoration task t11 indicates as to whether the event indicating removing a cause of the paper jam is removed. The monitoring information for the out-of-toner generation task t2 is the number of times an event indicating discharging a sheet is received. The monitoring information for the out-of-toner restoration task t21 indicates as to whether the event indicating replacing toner is removed. The monitoring information for the memory full generation task t3 is memory consumption.

Subsequently, the task determines whether the condition of the task is satisfied by comparing the monitoring information and the condition of the task (step S304). For example, whether the condition of the task is satisfied is determined based on whether the 99$^{th}$ sheet is fed.

When the condition of the task is satisfied ("YES" in step S304), the task changes the status of the simulator 11 (step S305). Specifically, the task shifts the status of the simulator 11 to the status set in the task. The status of the simulator 11 may, for example, be changed by changing any one of values of parameters included in the simulator 11. Subsequently, the task returns to the task manager 15 a response indicating that the condition is satisfied (step S306). Note that when the API is retrieved from the application 20 after the status of the simulator 11 is shifted, the simulator 11 simulates a process to be executed by the target apparatus in the shifted status.

On the other hand, when the received event is not subject to monitoring ("NO" in step S302), or when the condition of the task is not satisfied ("NO" in step S304), the task returns a response indicating that the condition is not satisfied.

Next, a specific illustration is five of the process to be executed in relation to the test definition data illustrated in FIG. 4.

The operation executor 12 instructs the simulator 11 to execute a print process associated with testdata.prn, based on a print element within a first step element (step element having a number attribute value of 1) of the scenario element 520. Note that testdata.prn may, for example, be stored in a predetermined folder. Subsequently, the operation executor 12 is in a standby mode for ten minutes to input the instruction address to the simulator 11, based on a wait element within a second step element.

On the other hand, the simulator 11 starts to emulate a print process of testdata.prn (hereinafter simply called a "print process") based on the instruction from the operation executor 12.

The simulator 11 requests the event reporter 13 to issue an event indicating the change of the status of the simulator 11 or other events during the print process. The event reporter 13 reports the requested event to the task manager 15. The task manager 15 executes the process illustrated in FIG. 6 in response to the reported event, and reports the event of the executed process to effective task.

In this embodiment, there is a parent-child relationship between the paper jam generation task t1 and the paper jam restoration task t11, and there is a parent-child relationship between the out-of-toner generation task t2 and the out-of-toner restoration task t21. Further, the memory full generation task t3 includes a sibling relationship with the paper jam generation task t1 and the out-of-toner generation task t2. Thus, in an initial state, the event is reported to the paper jam generation task t1, the out-of-toner generation task t2, and the memory full generation task t3. Each of the tasks executes a process illustrated in FIG. 7 in response to the reported event.

As a result, the condition of the paper jam generation task t1 is satisfied at an event of feeding the 99$^{th}$ sheet. Hence, the paper jam generation task t1 shifts the simulator 11 to a paper jam status. Further, the task manager 15 terminates the paper jam generation task t1 along with satisfying the condition of the paper jam generation task t1. As a result, the paper jam restoration task t11 is made effective.

When 10 minutes have elapsed from the start of printing, the operation executor 12 executes a pseudo-paper jam removing operation on the simulator 11 based on a remove-jam element within a third step element. The simulator 11 requests the event reporter 13 to issue a paper jam removing event according to the paper jam removing operation. When the event reporter 13 reports the paper jam removing event to the task manger 15, the task manager 15 reports the paper jam removing event to the paper jam restoration task t11, the out-of-toner generation task t2, and the memory full generation task t3. The condition of the paper jam restoration task t11 is satisfied according to the paper jam removing event. Hence, the paper jam restoration task t11 ends after resolving the paper jam status of the simulator 11.

Subsequently, the operation executor 12 is in a standby mode for ten minutes based on a wait element within a fourth step element.

On the other hand, the simulator 11 restarts a print process in response to resolution of the paper jam status. In the restarted print process, the condition of the out-of-toner generation task t2 is satisfied at a 198$^{th}$ sheet discharging event. Hence, the out-of-toner generation task t2 ends after shifting the simulator 11 to the out-of-toner status. The out-of-toner restoration task t21 is made effective along with the end of the out-of-toner generation task t2.

When 10 minutes have elapsed from the resolution of the paper jam, the operation executor 12 executes a pseudo-toner replacing operation on the simulator 11 based on a changetoner replacing operation within a fifth step element. The simulator 11 requests the event reporter 13 to issue a toner replacing event according to the toner replacing operation. When the event reporter 13 reports the toner replacing event to the task manger 15, the task manager 15 reports the toner replacing event to the out-of-toner restoration task t21, and the memory full generation task t3. The condition of the out-of-toner restoration task t21 is satisfied according to the toner replacing event. Hence, the out-of-toner restoration task t21 ends after cancelling the out-of-toner status of the simulator 11.

The simulator 11 restarts a print process in response to the resolution of the out-of-toner status. In the restarted print process, the condition of the memory full generation task t3 is satisfied at a $220^{th}$ sheet analyzing event. Hence, the memory full generation task t3 ends after shifting the simulator 11 to the memory full status. Note that the application 20 subject to evaluation may, for example, interrupt the job in execution.

As described above, according to the embodiment, the simulator 11 may be shifted to a status specified in the status change condition at the timing specified in the status change condition in the course of executing a process according to an operation instruction specified in the test scenario. That is, the above-described embodiment may reproduce various statuses of the apparatus subject to emulation. Hence, the user may be able to check operational capabilities of the application 20 in various possible statuses of the target apparatus.

Note that the present embodiment illustrates an example in which the apparatus (the target apparatus) emulated by the simulator 11 is an image forming apparatus. However, the apparatus emulated by the simulator 11 may be an apparatus other than the image forming apparatus such as a projector, a teleconferencing system, a digital still camera, or the like.

In addition, the function of the information processing apparatus 10 according to the present embodiment may be provided as a service provided by a cloud service or an application service provider (ASP), or a Web service, or the like utilized via a network. In this case, the application 20 may be installed in the user's side personal computer (PC) connected to the information processing apparatus 10 via a network, or may be uploaded into the information processing apparatus 10.

The above-described embodiment may be able to reproduce various statuses of the apparatus subject to simulation.

Note that in the above embodiment, the information processing apparatus 10 is an example of an information processing apparatus or an information processing system. Each of the tasks is an example of a status changer. The definition associated with the test scenario is an example of first definition information. The definition associated with the status change condition is an example of second definition information.

Note also that in the above embodiment, the term "emulate" or "imitate" includes the meaning of "simulate", and hence, "emulate", "imitate", and "simulate" may be interchangeably used.

Likewise, in the above embodiment, the "simulator" may be implemented by an "emulator", and hence, the simulator and the emulator may be interchangeably used.

The embodiments of the present invention are described above. However, the present invention is not limited to the specifically disclosed embodiments, and variations and modifications may be made without departing from the scope of the present invention.

The present application is based on Japanese Priority Application No. 2013-190397 filed on Sep. 13, 2013, and Japanese Priority Application No. 2014-129901 filed on Jun. 25, 2014, the entire contents of which are hereby incorporated herein by reference.

What is claimed is:

1. An information processing apparatus comprising:
circuitry configured to
implement a simulator to simulate a first process to be executed by an apparatus based on an operation procedure defined in first definition information;
detect arrival of a time specified in second definition information by monitoring an event generated based on the simulated first process, and change a status of the simulator to a status specified in the second definition information based on the detected time;
determine whether a condition of the first process is satisfied;
if it is determined that the condition of the first process is satisfied, determine whether there is a second process to be executed by the apparatus, the first process having a parent-child relationship with the second process in which the second process cannot begin until the condition of the first process is satisfied;
if it is determined that there is the second process, simulate the second process in the simulator;
determine whether there is a third process to be executed by the apparatus, the first process having a sibling relationship with the third process in which the third process can begin even if the condition of the first process is not satisfied; and
if it is determined that there is the third process, simulate the third process in the simulator.

2. The information processing apparatus as claimed in claim 1, wherein
the second definition information includes one or more combinations of information specifying a time to change the status of the simulator and information specifying the changed status of the simulator,
the circuitry is configured to operate in accordance with each of the combinations, and
the circuitry is configured to detect arrival of a time specified in each of the combinations in the second definition information by monitoring the event generated based on the simulated first process, and to change the status of the simulator to a status specified in said each of the combinations in the second definition information based on the detected time.

3. The information processing apparatus as claimed in claim 2, wherein
a relationship between at least some the combinations in the second definition information is a serial relationship that reflects the parent-child relationship.

4. The information processing apparatus as claimed in claim 3, wherein
the circuitry is configured, in response to one of the combinations having the serial relationship, to change the status of the simulator, and, in response to another of the combinations having the serial relationship, to restore the status of the simulator from the changed status.

5. The information processing apparatus as claimed in claim 1, wherein
the circuitry is configured to implement the simulator by an emulator configured to emulate the first process to be executed by the apparatus based on the operation procedure defined in the first definition information.

6. A method for processing information, the method being executed by a computer, the method, comprising:
  causing a simulator of the computer to simulate a first process to be executed by an apparatus based on an operation procedure defined in first definition information;
  detecting arrival of a time specified in second definition information by monitoring an event generated based on the simulated first process, and changing a status of the simulator to a status specified in the second definition information based on the detected time;
  determining whether a condition of the first process is satisfied;
  if it is determined that the condition of the first process is satisfied, determining whether there is a second process to be executed by the apparatus, the first process having a parent-child relationship with the second process in which the second process cannot begin until the condition of the first process is satisfied;
  if it is determined that there is the second process, simulating the second process in the simulator;
  determining whether there is a third process to be executed by the apparatus, the first process having a sibling relationship with the third process in which the third process can begin even if the condition of the first process is not satisfied; and
  if it is determined that there is the third process, simulating the third process in the simulator.

7. The method as claimed in claim 6, wherein
  the second definition information includes one or more combinations of information specifying a time to change the status of the simulator and information specifying the changed status of the simulator,
  said detecting is carried out in accordance with each of the combinations,
  said detecting comprises detecting arrival of a time specified in each of the combinations in the second definition information by monitoring the event generated based on the simulated first process, and
  said changing the status comprises changing the status of the simulator to a status specified in said each of the combinations in the second definition information based on the detected time.

8. The method as claimed in claim 7, wherein
  a relationship between at least some the combinations in the second definition information is a serial relationship that reflects the parent-child relationship.

9. The method as claimed in claim 8, wherein
  said changing the status comprises, in response to one of the combinations having the serial relationship, changing the status of the simulator, and, in response to another of the combinations having the serial relationship, to restore the status of the simulator from the changed status.

10. The method as claimed in claim 6, wherein
  said method is performed using an emulator configured to emulate the first process to be executed by the apparatus based on the operation procedure defined in the first definition information.

11. A computer program product for being executed on a computer, the computer program product, when executed on the computer, causing the computer to perform following functions, the functions comprising:
  implementing a simulator to simulate a first process to be executed by an apparatus based on an operation procedure defined in first definition information;
  detecting arrival of a time specified in second definition information by monitoring an event generated based on the simulated first process, and changing a status of the simulator to a status specified in the second definition information based on the detected time;
  determining whether a condition of the first process is satisfied;
  if it is determined that the condition of the first process is satisfied, determining whether there is a second process to be executed by the apparatus, the first process having a parent-child relationship with the second process in which the second process cannot begin until the condition of the first process is satisfied;
  if it is determined that there is the second process, simulating the second process in the simulator;
  determining whether there is a third process to be executed by the apparatus, the first process having a sibling relationship with the third process in which the third process can begin even if the condition of the first process is not satisfied; and
  if it is determined that there is the third process, simulating the third process in the simulator.

12. The computer program product as claimed in claim 11, wherein
  the second definition information includes one or more combinations of information specifying a time to change the status of the simulator and information specifying the changed status of the simulator,
  said detecting is performed in accordance with each of the combinations,
  said detecting comprises detecting arrival of a time specified in the corresponding one of the combinations in the second definition information by monitoring an event generated based on the simulated process, and
  said changing the status comprises changing status of the simulator to a status specified in said each of the combinations in the second definition information based on the detected time.

13. The computer program product as claimed in claim 12, wherein
  a relationship between at least some the combinations in the second definition information is a serial relationship that reflects the parent-child relationship.

14. The computer program product as claimed in claim 13, wherein
  said changing the status comprises, in response to one of the combinations having the serial relationship, changing the status of the simulator, and, in response to another of the combinations having the serial relationship, to restore the status of the simulator from the changed status.

15. The computer program product as claimed in claim 11, wherein
  said implementing the simulator is performed using an emulator configured to emulate the first process to be executed by the apparatus based on the operation procedure defined in the first definition information.

* * * * *